(12) United States Patent
Sekiya (10) Patent No.: US 12,217,966 B2
(45) Date of Patent: Feb. 4, 2025

(54) PROCESSING METHOD OF WAFER, PROTECTIVE SHEET, AND PROTECTIVE SHEET LAYING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 310 days.

(21) Appl. No.: 17/381,784

(22) Filed: Jul. 21, 2021

(65) Prior Publication Data

US 2022/0037160 A1 Feb. 3, 2022

(30) Foreign Application Priority Data

Jul. 29, 2020 (JP) .................................. 2020-128468
Apr. 2, 2021 (JP) .................................. 2021-063429

(51) Int. Cl.
*H01L 21/304* (2006.01)
*H01L 21/02* (2006.01)
*H01L 21/78* (2006.01)

(52) U.S. Cl.
CPC ...... *H01L 21/304* (2013.01); *H01L 21/02013* (2013.01); *H01L 21/78* (2013.01); *H01L 2224/85207* (2013.01)

(58) Field of Classification Search
CPC . H01L 21/304; H01L 21/02013; H01L 21/78; H01L 2224/85207;

(Continued)

(56) References Cited

U.S. PATENT DOCUMENTS 6,623,594 B1 * 9/2003 Yamamoto .......... H01L 21/6836
428/354
2014/0060623 A1 * 3/2014 Naitou .................... B32B 27/20
156/244.11

(Continued)

FOREIGN PATENT DOCUMENTS

JP 2005246491 A 9/2005
JP 2020027916 A 2/2020

(Continued)

OTHER PUBLICATIONS

Search report issued in counterpart Singapore patent application No. 10202107099Y, dated Sep. 16, 2022.

(Continued)

*Primary Examiner* — Thanh T Nguyen
(74) *Attorney, Agent, or Firm* — Greer Burns & Crain Ltd.

(57) ABSTRACT

There is provided a processing method of a wafer. The processing method includes a protective sheet preparation step of preparing a protective sheet including a first sheet that is thermocompression-bonded to a surface of the wafer by heating, a second sheet that is laid on the first sheet and has fluidity due to the heating, and a third sheet that is laid on the second sheet and keeps flatness even with the heating. The processing method also includes a protective sheet laying step of causing a side of the first sheet to face a front surface of the wafer and executing heating to execute thermocompression bonding to lay the protective sheet on the front surface of the wafer and a grinding step of causing a side of the protective sheet to be held by a holding surface of a chuck table and grinding a back surface of the wafer.

8 Claims, 5 Drawing Sheets

(58) Field of Classification Search
CPC ... H01L 2221/68327; H01L 2221/6834; H01L 21/6836; H01L 21/6835; B32B 27/32; B32B 27/36; B32B 2323/04; B32B 2323/10; B32B 2367/00
See application file for complete search history.

(56) References Cited

U.S. PATENT DOCUMENTS

2018/0282596 A1* 10/2018 Kusumoto ................ C09J 7/29
2020/0058537 A1    2/2020 Sekiya
2020/0101675 A1*  4/2020 Soeda ................. B32B 15/085

FOREIGN PATENT DOCUMENTS

TW    201945493 A    12/2019
WO    2011152045 A1  12/2011

OTHER PUBLICATIONS

Office Action issued in counterpart Japanese patent application No. 2021-063429, dated Dec. 10, 2024.

* cited by examiner

PROCESSING METHOD OF WAFER, PROTECTIVE SHEET, AND PROTECTIVE SHEET LAYING METHOD

BACKGROUND OF THE INVENTION

Field of the Invention

The present invention relates to a processing method of a wafer, a protective sheet laid on a front surface of a wafer, and a protective sheet laying method for laying a protective sheet on a wafer.

Description of the Related Art

For a wafer on which plural devices such as integrated circuits (ICs) or large-scale integrations (LSIs) are formed on a front surface in such a manner as to be marked out by plural planned dividing lines that intersect, a back surface thereof is ground by a grinding apparatus, and the wafer is formed into a predetermined thickness. Thereafter, the wafer is divided into individual device chips by a dicing apparatus, and the device chips obtained by the dividing are used for electrical equipment such as portable phones and personal computers.

The grinding apparatus includes at least a chuck table having a holding surface that holds a wafer, a grinding unit that rotatably includes a grinding wheel that grinds an upper surface of the wafer held by the chuck table, and a feed mechanism that executes grinding feed of grinding abrasive stones, and can process the wafer into a desired thickness (for example, refer to Japanese Patent Laid-open No. 2005-246491).

When the back surface of the wafer is ground by the grinding apparatus, a protective sheet having an adhesive layer including a glue agent is stuck to the front surface of the wafer in order to prevent plural devices formed on the front surface of the wafer from getting scratched due to contact between the holding surface of the chuck table and the front surface of the wafer.

In particular, in a case in which plural protruding electrodes referred to as bumps are formed on surfaces of the devices and the front surface of the wafer has recesses and projections, even when the protective sheet is stuck to the front surface of the wafer, the amount of grinding of the back surface corresponding to the individual bumps is affected by these bumps and becomes larger than in another region in grinding of the back surface of the wafer, so that dents (dimples) are generated in the back surface of the wafer corresponding to the bumps in some cases. Thus, it is conceivable that the influence of the bumps is suppressed through absorbing the recesses and the projections by the protective sheet laid on the front surface of the wafer. However, in a case in which the protective sheet having the adhesive layer is stuck, the following problem occurs. When the protective sheet is separated from the front surface of the wafer after the end of the grinding, part of the glue agent of the adhesive layer remains on the front surface of the wafer and the quality of the devices is lowered.

SUMMARY OF THE INVENTION

Regarding the above-described problem, the present applicant has found the fact that a glue does not remain on the front surface of a wafer when a thermocompression bonding sheet such as a polyolefin sheet that does not have an adhesive layer formed by a glue agent or the like is laid on the front surface of the wafer and the thermocompression bonding sheet is separated after grinding processing is executed for the back surface of the wafer. Thus, the present applicant is diligently making studies on employing the thermocompression bonding sheet as the protective sheet. However, although recesses and projections attributed to bumps and so forth can be absorbed to some extent by laying the thermocompression bonding sheet on the wafer by thermocompression bonding, the following problem has been revealed. When the thermocompression bonding sheet is heated to a temperature at which an adhesive force is exerted, wrinkles are generated in the thermocompression bonding sheet and it becomes difficult to surely hold the wafer on a chuck table of a grinding apparatus. In addition, distortion is caused in the wafer due to the wrinkles of the thermocompression bonding sheet and it is impossible to grind the wafer into an even thickness in some cases.

Thus, an object of the present invention is to provide a protective sheet that allows a wafer to be surely held on a chuck table and allows the wafer to be ground into an even thickness by being applied to the wafer ground by a grinding apparatus and a protective sheet laying method for laying the protective sheet on a wafer.

In accordance with an aspect of the present invention, there is provided a processing method of a wafer. The processing method includes a protective sheet preparation step of preparing a protective sheet including a first sheet that is thermocompression-bonded to a surface of the wafer by heating, a second sheet that is laid on the first sheet and has fluidity due to the heating, and a third sheet that is laid on the second sheet and keeps flatness even with the heating. The processing method also includes a protective sheet laying step of causing a side of the first sheet to face a front surface of the wafer and executing heating to execute thermocompression bonding to lay the protective sheet on the front surface of the wafer and a grinding step of causing a side of the protective sheet to be held by a holding surface of a chuck table and grinding a back surface of the wafer.

In accordance with another aspect of the present invention, there is provided a protective sheet laid on a surface of a wafer. The protective sheet includes a first sheet that is thermocompression-bonded to the surface of the wafer by heating, a second sheet that is laid on the first sheet and has fluidity due to the heating, and a third sheet that is laid on the second sheet and is allowed to keep flatness even with the heating.

Preferably, the first sheet and the second sheet are configured by a polyolefin-based resin, and the third sheet is configured by a polyester-based resin. Alternatively, the first sheet is configured by polypropylene, the second sheet is configured by polyethylene, and the third sheet is configured by polyethylene terephthalate.

In accordance with a further aspect of the present invention, there is provided a protective sheet laying method for laying a protective sheet on a wafer by thermocompression bonding. The protective sheet laying method includes a protective sheet placement step of placing the protective sheet on an upper surface of the wafer and a thermocompression bonding step of executing thermocompression bonding through pressing the protective sheet placed on the upper surface of the wafer and heating the protective sheet. A heating temperature when the thermocompression bonding of the protective sheet is executed in the thermocompression bonding step is a temperature at which the first sheet exerts an adhesive force, the second sheet has fluidity, and the third sheet keeps flatness.

According to the processing method of a wafer in accordance with the aspect of the present invention, even when recesses and projections attributed to bumps and so forth exist in the front surface of the wafer, the recesses and projections transferred to the first sheet due to the thermocompression bonding when the protective sheet is laid are absorbed by the second sheet. In addition, the flatness is kept by the third sheet. Thus, it becomes easy to hold the wafer on the chuck table of a grinding apparatus. In addition, the wafer can be ground into an even thickness.

According to the protective sheet in accordance with the aspect of the present invention, even when recesses and projections attributed to bumps and so forth exist in the front surface of the wafer, the recesses and projections transferred to the first sheet due to the thermocompression bonding when the protective sheet is laid are absorbed by the second sheet. In addition, the flatness is kept by the third sheet. Thus, it becomes easy to hold the wafer on the chuck table of a grinding apparatus. In addition, the wafer can be ground into an even thickness.

According to the protective sheet laying method in accordance with the aspect of the present invention, even when recesses and projections are generated in the first sheet due to the thermocompression bonding when the protective sheet is laid on the front surface of the wafer, the recesses and projections can be absorbed by the second sheet, and the flatness can be kept by the third sheet. Thus, it becomes easy to hold the wafer on the chuck table of a grinding apparatus. In addition, the wafer can be ground into an even thickness.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A processing method of a wafer, a protective sheet, and a protective sheet laying method for laying the protective sheet on a wafer according to an embodiment of the present invention will be described in detail below with reference to the accompanying drawings.

Figure 1A:
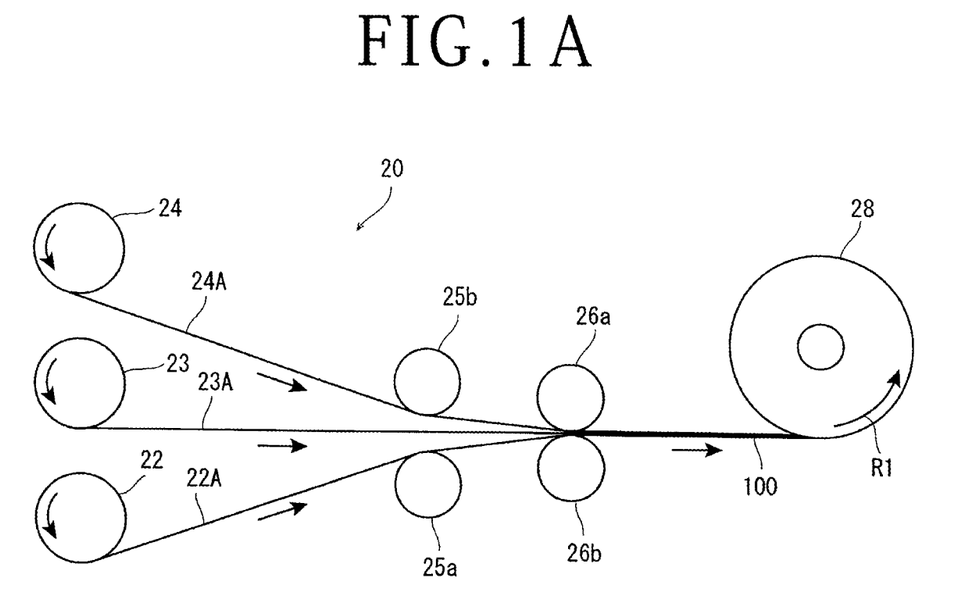
FIG. 1A is a conceptual diagram of a protective sheet manufacturing machine.

FIG. 1A illustrates a conceptual diagram of a protective sheet manufacturing machine 20 suitable for a protective sheet preparation step of preparing a protective sheet 100 to be laid on a surface (front surface) of a wafer in executing the processing method of a wafer according to the present embodiment. The protective sheet manufacturing machine 20 includes a first sheet roll 22 that supplies a first sheet 22A, a second sheet roll 23 that supplies a second sheet 23A, a third sheet roll 24 that supplies a third sheet 24A, a first guide roller 25a that adjusts the tension of the first sheet 22A supplied from the first sheet roll 22 and sends the first sheet 22A, and a second guide roller 25b that adjusts the tension of the third sheet 24A supplied from the third sheet roll 24 and sends the third sheet 24A. The protective sheet manufacturing machine 20 also includes pressure bonding rollers 26a and 26b, the pressure bonding rollers 26a and 26b heating the first sheet 22A, the second sheet 23A, and the third sheet 24A that have passed between the first guide roller 25a and the second guide roller 25b and applying a pressure thereto from in the upward and downward directions to execute thermocompression bonding of these three sheets, and a protective sheet roll 28 that rolls up the protective sheet 100 into which the three sheets are integrated through the thermocompression bonding due to the passing between the pressure bonding rollers 26a and 26b. A heater that can adjust the temperature and about which diagrammatic representation is omitted is incorporated in both or either one of the pressure bonding rollers 26a and 26b, and surfaces of the pressure bonding rollers 26a and 26b are coated with a fluorine resin for preventing adhesion of the respective sheets. Further, a drive motor about which diagrammatic representation is omitted is disposed in the protective sheet roll 28, and the protective sheet roll 28 can be rotated in a direction depicted by an arrow R1.

It is preferable that a sheet of a resin that exerts an adhesive force by being heated and is suitable to be thermocompression-bonded to a wafer to be described later be selected as the first sheet 22A and the first sheet 22A be employed from either of a sheet of a polyolefin-based resin and a sheet of a polyester-based resin, for example. Further, it is preferable that the second sheet 23A also be selected from sheets that are made of a resin and have fluidity and exert an adhesive force by being heated and be employed from either of a sheet of a polyolefin-based resin and a sheet of a polyester-based resin, for example. Moreover, it is preferable that the third sheet 24A also be selected from sheets made of a resin and be employed from either of a sheet of a polyolefin-based resin and a sheet of a polyester-based resin, for example. Regarding the respective sheets, when the material is employed from polyolefin-based resins, the material is selected from polyethylene (PE), polypropylene (PP), and polystyrene (PS), for example. Furthermore, when the material is employed from polyester-based resins, the material is selected from polyethylene terephthalate (PET) and polyethylene naphthalate (PEN), for example.

Regarding the first sheet 22A, the second sheet 23A, and the third sheet 24A in the present embodiment, when the melting temperature of the first sheet 22A is defined as T1, the melting temperature of the second sheet 23A is defined as T2, and the melting temperature of the third sheet 24A is defined as T3, it is preferable that the following condition be satisfied.

$$T1, T2 < T3 \qquad (1)$$

Moreover, it is more preferable to select sheets that satisfy the following condition.

$$T2 < T1 < T3 \quad (2)$$

In the present embodiment, the protective sheet 100 manufactured by a manufacturing method illustrated in FIGS. 1A and 1B will be described on the premise that the first sheet 22A, the second sheet 23A, and the third sheet 24A that satisfy the condition of the above-described condition expression (2) are selected.

As the first sheet 22A illustrated in FIG. 1A, a polypropylene (PP) sheet, which is a polyolefin-based resin, is selected, for example. As the second sheet 23A, a polyethylene (PE) sheet, which is a polyolefin-based resin, is selected, for example. As the third sheet 24A, a polyethylene terephthalate (PET) sheet, which is a polyester-based resin, is selected, for example. When the first sheet 22A is the polypropylene sheet, the melting temperature T1 is 160° C. to 180° C. When the second sheet 23A is the polyethylene sheet, the melting temperature T2 is 120° C. to 140° C. When the third sheet 24A is the polyethylene terephthalate sheet, the melting temperature T3 is 250° C. to 270° C.

In a case of manufacturing the protective sheet 100 by using the protective sheet manufacturing machine 20 illustrated in FIG. 1A, the heater incorporated in the pressure bonding rollers 26a and 26b is actuated. In addition, the drive motor of the protective sheet roll 28 is actuated to rotate the protective sheet roll 28 in the direction depicted by the arrow R1. Here, the heating temperature by the heater is a temperature at which at least the second sheet 23A exerts an adhesive force and is set (for example, 120° C.) to cause the temperature of the second sheet 23A to reach the vicinity of the melting temperature T2. Due to the rotation of the protective sheet roll 28 as illustrated in the diagram, the first sheet roll 22, the second sheet roll 23, and the third sheet roll 24 follow the rotation to rotate, and the first sheet 22A, the second sheet 23A, and the third sheet 24A are drawn out. In addition, these three sheets are sandwiched by the pressure bonding rollers 26a and 26b and are heated to a temperature close to the melting temperature T2 of the second sheet 23A. Due to this, the second sheet 23A becomes the state in which the second sheet 23A exerts the adhesive force, and the second sheet 23A is laid on the first sheet 22A. Simultaneously, the third sheet 24A is laid on the second sheet 23A, and thermocompression bonding is executed to cause the three sheets to become the three-layer protective sheet 100. The protective sheet 100 is rolled up by the protective sheet roll 28 to be completed. Through the above, the protective sheet preparation step of the processing method of a wafer according to the present embodiment is completed.

In the protective sheet manufacturing machine 20 of the present embodiment, the temperature when the protective sheet 100 is heated at the time of thermocompression bonding is set to the vicinity of the melting temperature T2 (120° C.) of the second sheet 23A. However, the present invention is not limited thereto, and the temperature may be a temperature that reaches the melting temperature T1 (160° C. to 180° C.) of the first sheet 22A. However, the whole of the protective sheet 100 extends when the heating is executed to a temperature that reaches the melting temperature T3 of the third sheet 24A. Therefore, it is preferable that the heating temperature by the pressure bonding rollers 26a and 26b when the protective sheet 100 is manufactured be lower than the melting temperature T3 of the third sheet 24A.

Figure 1B:
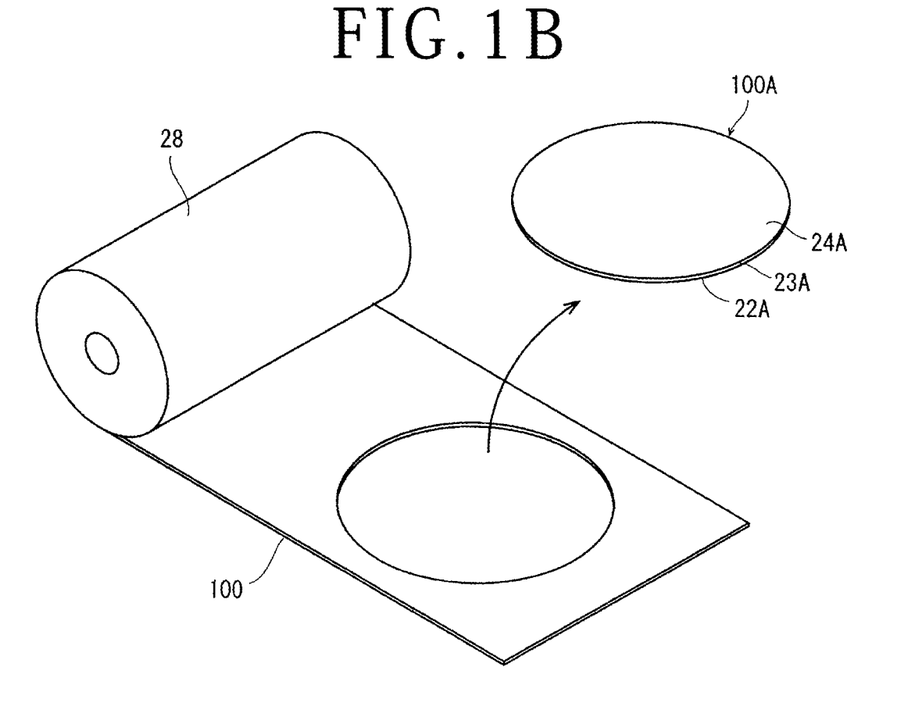
FIG. 1B is a perspective view of a completed protective sheet roll.

In FIG. 1B, the protective sheet roll 28 by which the protective sheet 100 prepared by the above-described protective sheet preparation step is rolled up is illustrated. A circular protective sheet 100A is cut out from the protective sheet 100 drawn out from the protective sheet roll 28 by using an appropriate cutter apparatus about which diagrammatic representation is omitted. The circular protective sheet 100A has a three-layer structure in which an upper surface thereof is configured by the above-described third sheet 24A, a lower surface thereof is configured by the above-described first sheet 22A, and the second sheet 23A is disposed between the first sheet 22A and the third sheet 24A. A description will be made below about a protective sheet laying step executed based on the protective sheet laying method for laying the above-described protective sheet 100A on a wafer by thermocompression bonding.

Figure 2A:
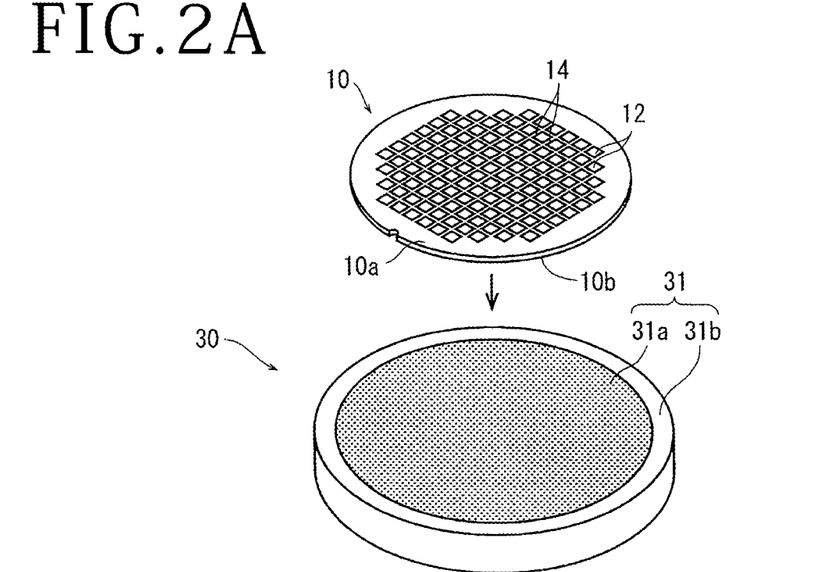
FIG. 2A is a perspective view illustrating a form of placement of a wafer on a chuck table of a thermocompression bonding apparatus.

In FIG. 2A, a wafer 10 that is a workpiece in the present embodiment is illustrated. The wafer 10 is configured by a silicon substrate, for example, and plural devices 12 are formed on a front surface 10a of the wafer 10 in such a manner as to be marked out by planned dividing lines 14. After the above-described wafer 10 has been prepared, the wafer 10 is conveyed to a chuck table 31 of a thermocompression bonding apparatus 30 (only part thereof is illustrated) illustrated in FIG. 2A. The chuck table 31 includes a suction adhesion chuck 31a formed of a porous component having gas permeability and a frame body 31b that surrounds the suction adhesion chuck 31a. The suction adhesion chuck 31a is connected to suction means about which diagrammatic representation is omitted through the frame body 31b, and a suction negative pressure is supplied to an upper surface of the suction adhesion chuck 31a.

Figure 2B:
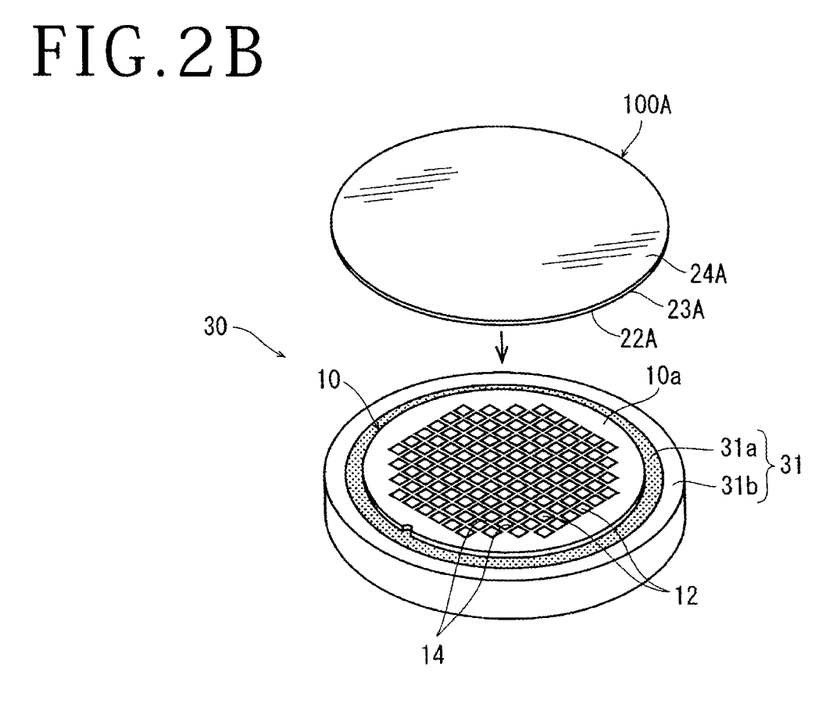
FIG. 2B is a perspective view illustrating a form of placement of a protective sheet on an upper surface of the wafer.

The wafer 10 conveyed to the thermocompression bonding apparatus 30 is placed at the center of the suction adhesion chuck 31a. As is understood from FIG. 2B, the suction adhesion chuck 31a is formed into a size larger than the wafer 10, and the suction adhesion chuck 31a is annularly exposed outside the wafer 10. Subsequently, the side of the first sheet 22A of the protective sheet 100A prepared in the protective sheet preparation step is made to face the upper surface (on the side of the front surface 10a) of the wafer 10, and the protective sheet 100A is placed on the wafer 10 (protective sheet placement step).

The protective sheet 100A in the present embodiment is formed with a size larger than the suction adhesion chuck 31a on which the wafer 10 is placed and can cover the whole of the suction adhesion chuck 31a as well as the wafer 10. In this case, it is preferable that the size of the protective sheet 100A be set to a size that is larger than the suction adhesion chuck 31a and is slightly smaller than the frame body 31b (see also FIG. 3A). In the present embodiment, the above-described circular protective sheet 100A is cut out from the protective sheet 100 drawn out from the protective sheet roll 28. However, the present invention is not necessarily limited to the cutout into the circular shape, and the protective sheet 100A may be cut out into a rectangular shape.

Figures 3A, 3B:
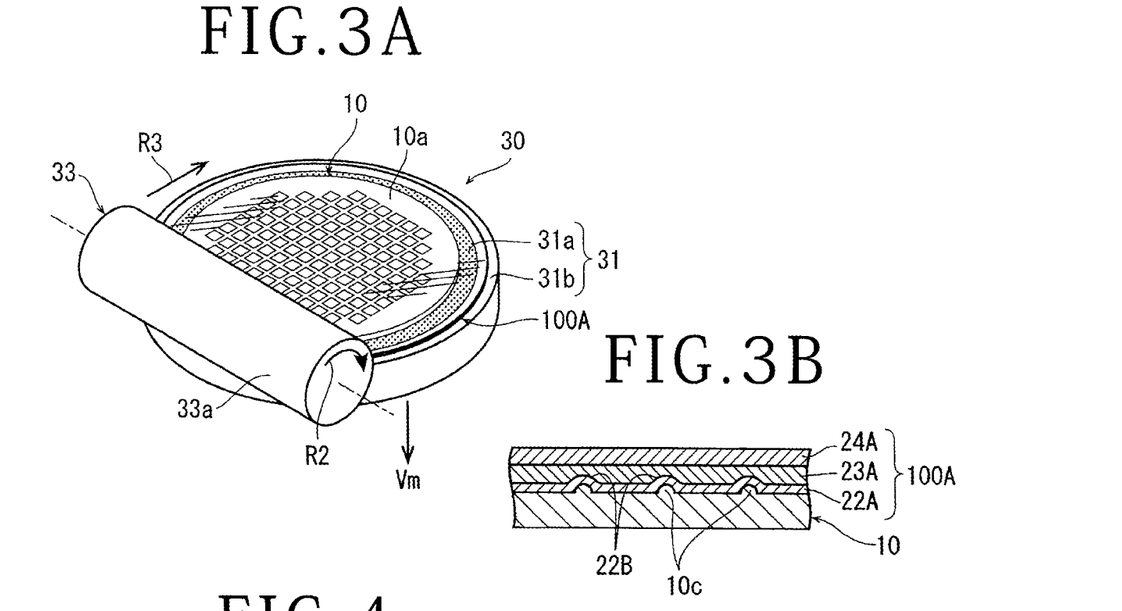
FIG. 3A is a perspective view illustrating an execution form of a thermocompression bonding step in a protective sheet laying step.
FIG. 3B is a partially enlarged sectional view at the time of the thermocompression bonding step illustrated in FIG. 3A.

Subsequently, the suction means that is connected to the suction adhesion chuck 31a and is not illustrated in the diagram is actuated, and, as illustrated in FIG. 3A, a suction negative pressure Vm is generated and is supplied to the suction adhesion chuck 31a to suck air among the protective sheet 100A, the wafer 10, and the suction adhesion chuck 31a and make a vacuum state. Then, a thermocompression bonding roller 33 is positioned above the wafer 10. A surface 33a of the thermocompression bonding roller 33 is coated with a fluorine resin. The thermocompression bonding roller 33 internally includes heating means about which diagrammatic representation is omitted and can heat the surface 33a to a desired temperature.

After the thermocompression bonding roller 33 has been positioned above the wafer 10, the heating means of the thermocompression bonding roller 33 is actuated, and the thermocompression bonding roller 33 is pressed against the wafer 10 from the side of the protective sheet 100A. Moreover, rotational drive means about which diagrammatic representation is omitted is actuated, and the thermocompression bonding roller 33 is rotated in a direction depicted by an arrow R2. In addition, the thermocompression bonding roller 33 is moved in a direction depicted by an arrow R3 (thermocompression bonding step). A heating temperature T0 when heating is executed by the heating means is set to become, for example, a temperature at which the first sheet 22A exerts an adhesive force, i.e., the melting temperature T1 (160° C. to 180° C.) of the first sheet 22A (polypropylene (PP)). As illustrated in FIG. 3B, due to the heating at the time of the thermocompression bonding, the first sheet 22A exerts the adhesive force and is thermocompression-bonded to the front surface 10a of the wafer 10. In addition, recesses and projections including projected parts 22B affected by bumps 10c are formed in a front surface of the first sheet 22A, i.e., on the side on which the second sheet 23A is laid.

As described above, the second sheet 23A (polyethylene (PE)) is laid on an upper surface of the first sheet 22A. Because the heating temperature T0 at the time of the thermocompression bonding is higher than the melting temperature T2 of the second sheet 23A, the second sheet 23A melts at a high degree compared with the first sheet 22A and becomes the state of having fluidity to absorb the recesses and projections formed in the front surface of the first sheet 22A. On the other hand, the melting temperature T3 of the third sheet 24A that is laid on an upper surface of the second sheet 23A and configures the upper surface of the protective sheet 100A is higher than the melting temperature T1 of the first sheet 22A and the melting temperature T2 of the second sheet 23A and is higher than the heating temperature T0 when the heating is executed by the thermocompression bonding roller 33. Thus, the third sheet 24A does not melt at the heating temperature T0 at the time of the thermocompression bonding, and the flatness thereof is kept on the second sheet 23A. The second sheet 23A that has fluidity due to the heating at the time of the thermocompression bonding and absorbs the recesses and projections of the first sheet 22A is sandwiched by the first sheet 22A and the third sheet 24A that keeps the flatness. Thus, wrinkles are not formed in the upper surface of the protective sheet 100A even when the thermocompression bonding step is completed and the temperature of the protective sheet 100A lowers.

Figure 4:
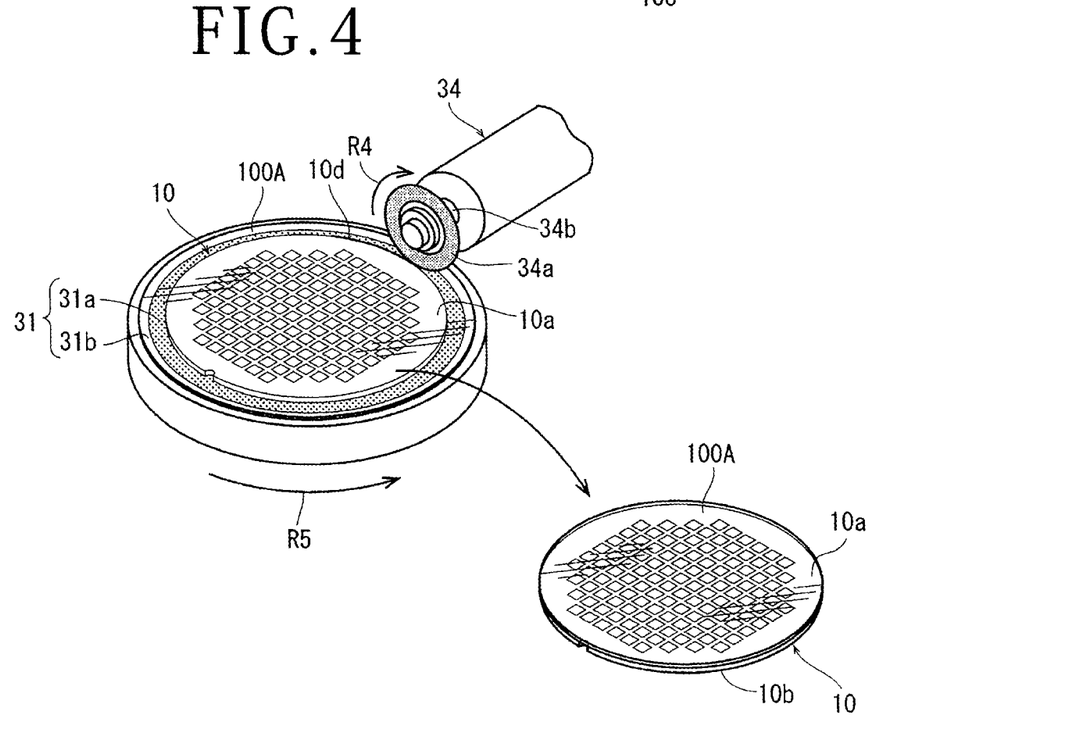
FIG. 4 is a perspective view illustrating a form of cutting out the protective sheet along an outer circumferential edge of the wafer.

After the protective sheet 100A has been laid on the upper surface of the wafer 10 by the protective sheet laying step based on the above-described protective sheet laying method, a cutter 34 illustrated in FIG. 4 is positioned above the chuck table 31. In the cutter 34, a blade 34a is disposed at the tip of a rotating shaft 34b and can be rotated in a direction depicted by an arrow R4 by a drive motor about which diagrammatic representation is omitted. After the cutter 34 is positioned above the chuck table 31, while the blade 34a is rotated in the direction depicted by the arrow R4, the blade 34a is lowered from the upper side of the protective sheet 100A to an outer circumferential edge 10d of the wafer 10 and cutting-in feed is executed, and the chuck table 31 is rotated in a direction of an arrow R5. Thereby, as illustrated in the diagram, the protective sheet 100A is cut into a shape along the outer circumferential edge 10d of the wafer 10 in the state in which the protective sheet 100A is laid on the front surface 10a of the wafer 10.

After the protective sheet 100A has been cut along the wafer 10, the wafer 10 is conveyed to a grinding apparatus 40 (only part thereof is illustrated) illustrated in FIGS. 5A and 5B in order to execute a grinding step of grinding a back surface 10b of the wafer 10, and the grinding step to be described below is executed.

Figure 5A:
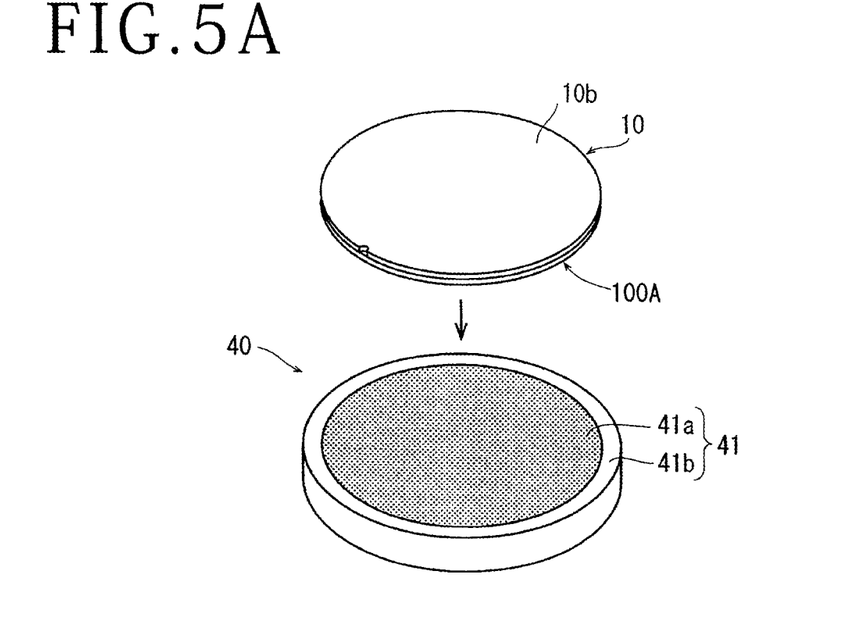
FIG. 5A is a perspective view illustrating a form of placement of the wafer on a chuck table of a grinding apparatus.
Figure 5B:
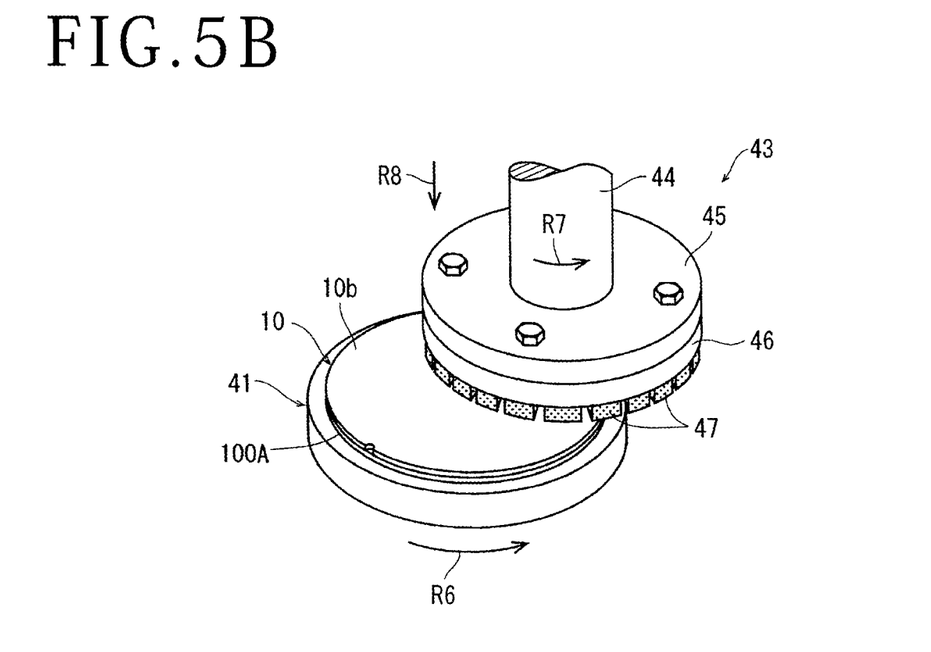
FIG. 5B is a perspective view illustrating an execution form of a grinding step.

The grinding apparatus 40 includes a chuck table 41 illustrated in FIG. 5A and a grinding unit 43 illustrated in FIG. 5B. The chuck table 41 includes a suction adhesion chuck 41a that is formed of a porous component to suck the wafer 10 and has gas permeability and a frame body 41b that surrounds the suction adhesion chuck 41a. The suction adhesion chuck 41a is connected to a suction source about which diagrammatic representation is omitted, and a suction negative pressure is supplied to a holding surface of the suction adhesion chuck 41a by operation of this suction source. The chuck table 41 includes rotation means and movement means about which diagrammatic representation is omitted, and is configured to be capable of rotating by operation of the rotation means. In addition, by operation of the movement means, the chuck table 41 is moved between a carrying-out/in region in which the wafer 10 is carried out on the chuck table 41 and a grinding processing region in which grinding processing is executed by the grinding unit 43. The grinding unit 43 illustrated in FIG. 5B includes a rotating spindle 44 rotated by an electric motor that is not illustrated in the diagram, a wheel mount 45 disposed at a lower end of the rotating spindle 44, a grinding wheel 46 mounted on a lower surface of the wheel mount 45, and plural grinding abrasive stones 47 annularly disposed on a lower surface of the grinding wheel 46.

The wafer 10 conveyed to the grinding apparatus 40 is placed on the suction adhesion chuck 41a of the chuck table 41 positioned in the carrying-out/in region in such a manner that, as illustrated in FIG. 5A, the side of the back surface 10b is oriented upward and the side of the protective sheet 100A is oriented downward, and the wafer 10 is sucked and held by operation of the suction source. Subsequently, the chuck table 41 is moved to directly under the grinding unit 43 illustrated in FIG. 5B, i.e., to the grinding processing region, by the movement means, and the center of the wafer 10 sucked and held by the chuck table 41 is positioned to a position through which the grinding abrasive stones 47 annularly disposed pass as viewed from the upper side.

After the wafer 10 has been positioned to the grinding processing region, the chuck table 41 is rotated at, for example, 300 rpm in a direction depicted by an arrow R6 in FIG. 5B. Simultaneously with this, the rotating spindle 44 of the grinding unit 43 is rotated at, for example, 6000 rpm in a direction depicted by an arrow R7 in FIG. 5B. Then, a grinding feed mechanism that is not illustrated in the diagram is actuated, and the grinding unit 43 is lowered in a direction depicted by an arrow R8 and is brought close to the chuck table 41. Then, the grinding abrasive stones 47 are brought into contact with the back surface 10b of the wafer 10 from the upper side, and grinding feed is executed at a grinding feed rate of, for example, 1.0 μm/second. At this time, the grinding is advanced while the thickness of the wafer 10 is measured by a measurement gauge that is not illustrated in the diagram, and the back surface 10b is ground until the thickness of the wafer 10 becomes the desired thickness, so that the grinding step is completed.

According to the above-described embodiment, in laying the protective sheet 100A on the wafer 10 by thermocompression bonding, even when recesses and projections attributed to bumps and so forth are generated in the first sheet 22A, these recesses and projections are absorbed by the second sheet 23A. Moreover, the flatness of the surface of the protective sheet 100A can be kept by the third sheet 24A laid on the second sheet 23A. Thus, the wafer 10 on which the protective sheet 100A is laid can be sucked and held easily and surely by the chuck table 41 of the grinding apparatus 40. Therefore, the back surface 10b of the wafer 10 can be ground into an even thickness in the above-described grinding step.

Figure 6:
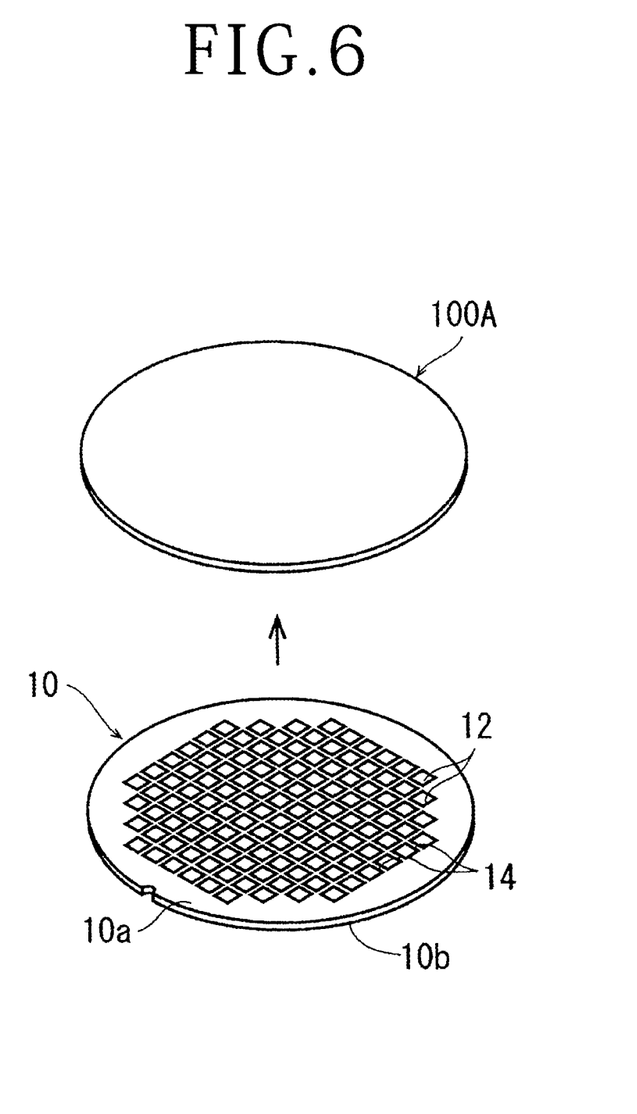
FIG. 6 is a perspective view illustrating a form of separation of the protective sheet from the wafer.

After the above-described grinding step has been completed, the protective sheet 100A is separated from the front surface 10a of the wafer 10 as illustrated in FIG. 6 at timing according to need. In separating the protective sheet 100A, it is preferable to make a state in which the protective sheet 100A is easily separated by heating or cooling the protective sheet 100A to a predetermined temperature.

The present invention is not limited to the above-described embodiment, and various modification examples are provided. For example, in the above-described embodiment, the first sheet 22A that configures the protective sheet 100 is configured by a sheet of polypropylene, the second sheet 23A is configured by a sheet of polyethylene, and the third sheet 24A is configured by polyethylene terephthalate. However, for example, the first sheet 22A may be configured by a sheet of polyethylene naphthalate (PEN), whose melting temperature is 260° C. to 280° C., the second sheet 23A may be configured by a sheet of polyethylene, whose melting temperature is 120° C. to 140° C., and the third sheet 24A may be configured by a sheet of polystyrene (PS), whose melting temperature is 220° C. to 240° C. Moreover, the first sheet 22A may be configured by a sheet of polystyrene, whose melting temperature is 220° C. to 240° C., the second sheet 23A may be configured by a sheet of polypropylene, whose melting temperature is 160° C. to 180° C., and the third sheet 24A may be configured by polyethylene terephthalate, whose melting temperature is 250° C. to 270° C. In any case, the heating temperature T0 when the protective sheet 100A is laid on the wafer 10 by thermocompression bonding can be set in such a manner that the first sheet 22A exerts an adhesive force, the second sheet 23A has fluidity, and the third sheet 24A keeps flatness.

In the above-described embodiment, the example in which the circular protective sheet 100A is laid on the front surface 10a of the wafer 10 is depicted. However, the protective sheet of the present invention is not limited thereto and may be what is used through being laid on the back surface 10b of the wafer 10 according to the kind of processing.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective sheet laid on a surface of a wafer, the protective sheet comprising:
   a first sheet that is thermocompression-bonded directly to the surface of the wafer by heating, wherein the first sheet is a polypropylene sheet;
   a second sheet that is laid on the first sheet and has fluidity due to the heating; and
   a third sheet that is laid on the second sheet and is allowed to keep flatness even with the heating;
   wherein the first sheet, the second sheet and the third sheet are thermocompression bonded to become a three layer protective sheet.

2. The protective sheet according to claim 1, wherein:
   the second sheet is configured by a polyolefin-based resin, and the third sheet is configured by a polyester-based resin.

3. The protective sheet according to claim 2, wherein:
   the second sheet is configured by polyethylene, and the third sheet is configured by polyethylene terephthalate.

4. The protective sheet according to claim 1, wherein:
   melting temperatures of the first sheet and the second sheet are lower than the third sheet.

5. The protective sheet according to claim 4, wherein:
   the melting temperature of the second sheet is less than the melting temperature of the first sheet.

6. The protective sheet according to claim 1, wherein:
   a heating temperature to execute the heating during the thermocompression bonding is higher than a melting temperature of the second sheet and lower than a melting temperature of the third sheet.

7. The protective sheet according to claim 1, wherein:
   a melting temperature of the second sheet is between 120° C. to 140° C.

8. The protective sheet according to claim 1, wherein:
   a melting temperature of the first sheet is between 160° C. to 180° C.

* * * * *